(12) United States Patent
Soper et al.

(10) Patent No.: US 12,428,718 B2
(45) Date of Patent: Sep. 30, 2025

(54) FILM STACK COMPOSITION, RELATED METHOD, AND APPLICATIONS

(71) Applicant: VERGASON TECHNOLOGY, INC., Van Etten, NY (US)

(72) Inventors: Joshua B. Soper, Candor, NY (US); Gregory A. Pilgrim, Ithaca, NY (US)

(73) Assignee: VERGASON TECHNOLOGY, INC., Van Etten, NY (US)

( * ) Notice: Subject to any disclaimer, the term of this patent is extended or adjusted under 35 U.S.C. 154(b) by 96 days.

(21) Appl. No.: 17/863,700

(22) Filed: Jul. 13, 2022

(65) Prior Publication Data

US 2023/0032284 A1 Feb. 2, 2023

Related U.S. Application Data

(60) Provisional application No. 63/224,012, filed on Jul. 21, 2021.

(51) Int. Cl.
| | |
|---|---|
| *C23C 14/14* | (2006.01) |
| *C23C 14/54* | (2006.01) |
| *C23C 14/58* | (2006.01) |

(52) U.S. Cl.
CPC ............ *C23C 14/14* (2013.01); *C23C 14/542* (2013.01); *C23C 14/58* (2013.01); *Y10T 428/24942* (2015.01); *Y10T 428/24975* (2015.01)

(58) Field of Classification Search
CPC ....... C23C 14/14; C23C 14/542; C23C 14/58; C23C 28/30; C23C 28/32; C23C 28/321; C23C 14/025; C23C 28/322; Y10T 428/24942; Y10T 428/24975
See application file for complete search history.

(56) References Cited

U.S. PATENT DOCUMENTS

| | | | |
|---|---|---|---|
| 7,132,130 B1* | 11/2006 | Kloss | ...................... C23C 14/14 427/295 |
| 2008/0038579 A1* | 2/2008 | Schuisky | .............. C23C 16/006 427/251 |
| 2019/0255563 A1* | 8/2019 | Koch | .................. C23C 14/3471 |

FOREIGN PATENT DOCUMENTS

JP 2005076085 A * 3/2005 ........... C23C 28/321

OTHER PUBLICATIONS

[NPL-1] Naoi et al. (JP 2005-076085 A); Mar. 24, 2005 (EPO machine translation to English). (Year: 2005).*

(Continued)

*Primary Examiner* — Donald M Flores, Jr.
(74) *Attorney, Agent, or Firm* — Klintworth & Rozenblat LLP; William Greener (57) ABSTRACT

A multi-layer PVD film stack contains a first layer higher index of refraction metal followed by a second layer semi-transparent lower index of refraction metal. The thickness of the second layer dictates the reflectivity of the second layer material. The second layer not only increases the reflectivity of the first layer, but it also decreases the reflectivity lost when the PVD film is topcoat lacquered. However, lacquering decreases the reflectivity of the higher index first layer (generally n value >1.9 at 632 nm). Using a higher refractive index metal as an opaque first layer followed by a semi-transparent second layer of a lower refractive index metal minimizes the darkening of the metal(s) after lacquer topcoat due to the lower refractive index of the second layer, which is in contact with the lacquer.

11 Claims, 7 Drawing Sheets

(56) References Cited

OTHER PUBLICATIONS

[NPL-2] Red Spot Pant and Varnish Company, Inc. (WayBackMachine time stamped Feb. 14, 2020); Complied various page entries of relevance; <http://redspot.com/products/pvd.html> and <http://redspot.com/products/clear-coatings.html>. (Year: 2020).*

* cited by examiner

FILM STACK COMPOSITION, RELATED METHOD, AND APPLICATIONS

RELATED APPLICATION DATA

The instant application claims priority to U.S. provisional application Ser. 63/224,012 filed Jul. 21, 2021, the subject matter of which is incorporated herein by reference in its entirety.

GOVERNMENT FUNDING

N/A

BACKGROUND

Aspects and embodiments disclosed herein most generally pertain to decorative, multi-layer thin film-coated substrates, methods for applying decorative, multi-layer thin film coatings on substrates, and applications thereof. More particular aspects and embodiments pertain to multi-layer thin film coatings on non-metallic (e.g., plastic) substrates that impart the appearance or look of highly reflective metal to the substrate and methods for applying the coatings. Most particularly, aspects and embodiments pertain to lacquer (or the like) top-coated substrates having a metallic multi-layer thin film coating in which a reduced reflectivity or darkening of the metallic thin film-coated substrate due to the lacquer top-coating is reduced or eliminated.

It has been observed that films comprised of certain metals noticeably visibly darken upon the application of a lacquer topcoat. Conversely, it has been observed that films comprised of certain other metals darken relatively noticeably less upon application of the lacquer topcoat. The cause of the relative variation in darkening between different metals after lacquer top-coating is believed to be due to the differences between two optical properties of metals, sometimes called the "optical constants," which describe the way they interact with incident light, on either side of the interface, the metal and the lacquer. These "optical constants" are Refractive Index (n) (a real, dimensionless number) and Extinction Coefficient (k) (an imaginary number). (As is known, the 'refractive index' of a metal is always a complex number). For clarity, neither is an actual constant given they both vary with photon energy and thus with the wavelength of the incident light. The closer the refractive index is to zero, the higher the reflectivity of the metal (in the visible spectrum). The extinction coefficient also plays a role in reflectivity but in a more complex way.

The Reflectivity (R) of a metal surface when immersed in a medium is governed by the following equation:

$$R = \frac{(n - n_i)^2 + k^2}{(n + n_i)^2 + k^2}$$

where: n=Refractive Index of the metal
$n_i$=Refractive Index of the medium containing the incident light
k=Extinction coefficient of the metal As can be shown mathematically, metals with a comparatively higher Refractive Index ($n_H$) tend to have poorer or lower reflectivity than those with a comparatively lower Refractive Index ($n_L$). It can also be shown that metals with a comparatively higher Refractive Index tend to darken more significantly when top-coated with lacquer than metals with a comparatively lower Refractive Index.

The aesthetic properties of metal films are subjective. However, possibly due to the familiarity of chrome plating, metals that look similar to chromium in terms of color and reflectivity are often preferred in decorative applications. Unlike chrome plating, which is relatively thick and durable, thin metallic films typically need a lacquer topcoat for protection due to their fragility. Unfortunately, chromium, which has a relatively high refractive index (in the context of higher n/lower n metals pertaining to the instant subject matter) darkens significantly when top-coated with lacquer. The resulting lower (poor) reflectivity makes it subjectively less desirable in decorative applications. Recognizing this problem, the inventors disclose herein an enabling solution.

Physical vapor deposition (PVD) of metal films for providing a commercially available decorative coating of a substrate with a topcoat of lacquer has existed for a long time. Mattox notes the use of PVD in the early 1960s by Red Spot Paint and Varnish to coat plastic substrates, followed by a clear protective lacquer (Mattox, D. and Mattox, V. H., 50 Years of Vacuum Coating Technology, 12 (2007)). These coatings were either first surface or second surface and required lacquer to protect the decorative PVD film. The typical metal film deposited was aluminum under vacuum.

PVD processes encompass a wide range of vapor-phase technologies, and is a general term used to describe any of a variety of methods to deposit thin solid films by the condensation of a vaporized form of the solid material onto various surfaces. PVD involves physical ejection of material as atoms or molecules and the condensation and nucleation of these atoms onto a substrate (Martin, P., Handbook of Deposition Techniques for Films and Coatings, 8 (2005)). Commercially available PVD techniques include thermal evaporation, electron beam evaporation, cathodic arc deposition, and magnetron sputtering. Any of these techniques are capable of producing multi-layer thin films by using two or more sources of different metals and sequentially depositing those metals so as to control the film thickness and density in a way that dictates the entire film's properties.

PVD films have seen a renewed interest based upon the colors they can provide. This recently began with a quest from the automotive market to replace hexavalent chromium (chrome VI) plating with PVD alternatives. This move was largely driven by the European Union's REACH Directive to restrict the use of Chrome VI based upon its hazardous nature to human health and the environment. Further investigation has also been directed to color possibilities and day/night effects of semi-transparent coatings that can be provided by PVD but not by traditional plating operations.

SUMMARY

An aspect of the invention is a metallic film/thin film stack composition for application onto a substrate. In an exemplary, non-limiting embodiment the metallic film stack composition includes a first layer of one or more metals each having an index of refraction equal to or greater than 1.9 disposed immediately adjacent the substrate surface, said first layer having a total thickness equal to or greater than 250 angstroms (A); a second, 'very thin' layer of one or more metals each having an index of refraction equal to or less than 1.5 disposed immediately adjacent the first layer, said second layer having a total thickness equal to or less than 200 A, wherein the second layer is semi-transparent over the visible spectrum; and a non-metallic, protective topcoat layer disposed immediately adjacent the second layer, wherein the topcoat layer is substantially transparent over the visible spectrum, whereby the typically observed darkening or lowered reflectivity of the first layer due to the topcoat layer is measurably and/or observably reduced or eliminated. Various non-limiting embodiments may include one or more of the following features, attributes, characterizations alone or in multiple combinations.

the metallic thin film stack composition, wherein the first layer is at least one of Co, Cr, Fe, Ge, Mo, Ni, Pb, Pd, Pt, Re, Rh, Si, Sn, Ti, V, W, Zn or alloys thereof;

the metallic thin film stack composition, wherein the second layer is at least one of Ag, Al, Au, Cu, In, Jr, Mg, Mo or alloys thereof.

the metallic thin film stack composition, wherein the topcoat layer is a lacquer or a paint.

the metallic thin film stack composition, comprising a PVD stack.

As will be appreciated by those skilled in the art, the first layer, relatively higher index metal(s) are chosen to exhibit a decorative 'color' appearance of the coated substrate, while the second layer, relatively lower index metal(s) are chosen to exhibit a decorative 'brightness' appearance of the coated substrate after topcoating with a protective lacquer layer.

An aspect of the invention is a method for creating a highly reflective, decorative, film/thin film coating on a substrate. In an exemplary, non-limiting embodiment the method includes the steps of providing a substrate to be decoratively coated; using PVD to deposit a first layer of one or more metals on the substrate, each metal having an index of refraction equal to or greater than 1.9 measured at 632 nm, at a thickness equal to or greater than 250 A; using PVD to deposit a second, thin layer of one or more metals onto the first layer, each metal having an index of refraction equal to or less than 1.5 measured at 632 nm, at a thickness equal to or less than 200 A, wherein the second layer is semi-transparent over the visible spectrum; and applying a protective, non-metallic, substantially transparent topcoat layer on the second layer. Various non-limiting embodiments may include one or more of the following steps, features, attributes, characterizations alone or in multiple combinations.

the method, further comprising drying the topcoat layer.

the method, wherein the topcoat layer is a lacquer or a paint.

DETAILED DESCRIPTION OF EXEMPLARY, NON-LIMITING EMBODIMENTS

Aspects and embodiments disclosed herein and claimed address the problem of darkening or reduced reflection of a highly reflective metallic base layer on a substrate due to the application of a protective non-metallic topcoat, typically lacquer.

The solution involves the deposition of a higher refractive index metal, or metals, as an opaque first layer having a total thickness equal to or greater than 250 A on a typically non-metallic substrate followed by the deposition of a 'very thin' (≤200 A), semi-transparent second layer of a lower refractive index metal. Upon topcoat lacquering, the resulting coating retains most of the aesthetically pleasing properties of the base metal(s), but minimizes the darkening of the metal(s) after topcoat, due to the low refractive index of the second layer, which is in contact with the lacquer.

As used herein, a list of comparatively higher refractive index metals includes Co, Cr, Fe, Ge, Mo, Ni, Pb, Pd, Pt, Re, Rh, Si, Sn, Ti, V, W, Zn or alloys thereof. These metals have indices n≥1.9 @ 632 nm; a list of comparatively lower refractive index metals includes Ag, Al, Au, Cu, In, Ir, Mg, or alloys thereof, having n≤1.5 @ 632 nm; and a 'very thin' layer (as that term is used herein) has a thickness ≤200 A.

In the embodiments disclosed and claimed herein, a high index of refraction metal used as a base or first layer on the substrate will be chosen for its inherent color and optical properties. A low index of refraction metal used as the second, very thin layer covering the first, base layer will be chosen to increase the reflectivity of the high index film layer and decrease the amount of reflectivity lost from topcoat lacquering.

In an aspect, a metal or plastic opaque substrate is mounted to a holding fixture for processing in a physical vapor deposition (PVD) machine with two or more metallic sources available for producing a multilayer film of at least one high index of refraction metal and one low index of refraction metal. The substrate may be basecoat lacquered with an organic, in order to smooth the surface to provide a specular reflection.

Once sufficient vacuum is achieved, the high index of refraction metal chosen for its color and optical properties is taken from bulk form to vapor form in order to transfer atoms or molecules of the base metal to the substrate. Once the atom or molecule contacts the substrate, it will condense and begin to form the first layer of the PVD film on the part. This will occur for enough time as required to build a film of 250 A or thicker on the surface of the substrate.

It is possible that the first layer of PVD film referenced above be a combination of two or more additional high index of refraction metals in order to tune the color and other film properties, such as adhesion or stress. These layers combined will be 250 A or thicker. Additional metals used in the high index of refraction layer require additional sources of material inside the PVD system. Depending on the PVD technique used, this may mean additional evaporant boats, banks of filaments, sputtering cathodes, etc.

Figure 1:
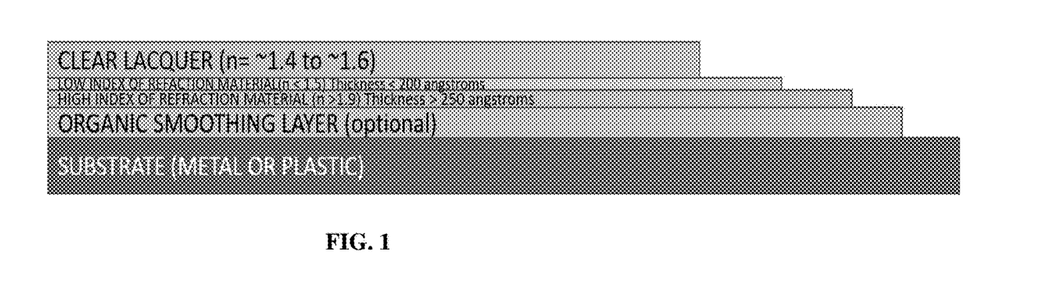
FIG. 1 schematically displays the substrate, organic smoothing layer, PVD stack, and topcoat lacquering according to an exemplary, non-limiting embodiment.
Figure 2:
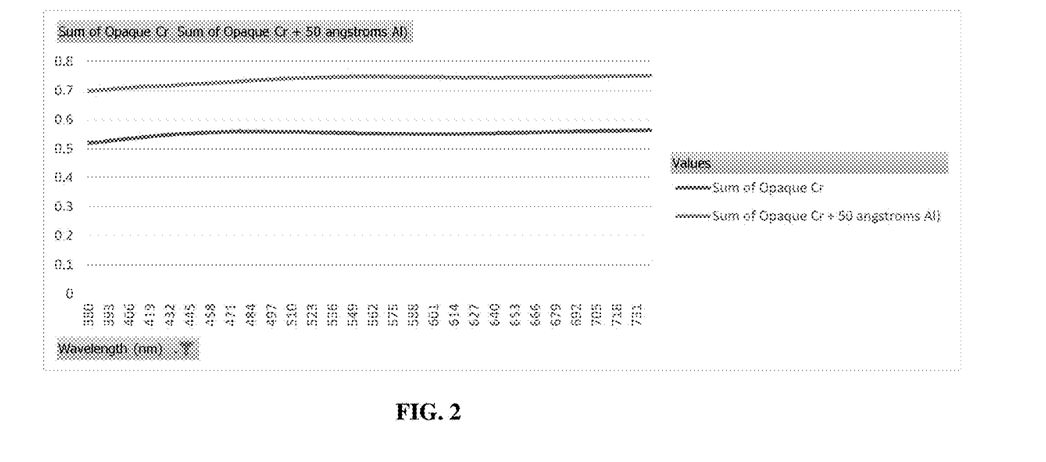
FIG. 2 is a graphical model showing reflectivity of an opaque chromium PVD film in air compared to the reflectivity of that same opaque chromium PVD with a 50 A layer of aluminum on top in air. It shows an increase of 20% in reflectivity by adding 50 A of aluminum.
Figure 3A:
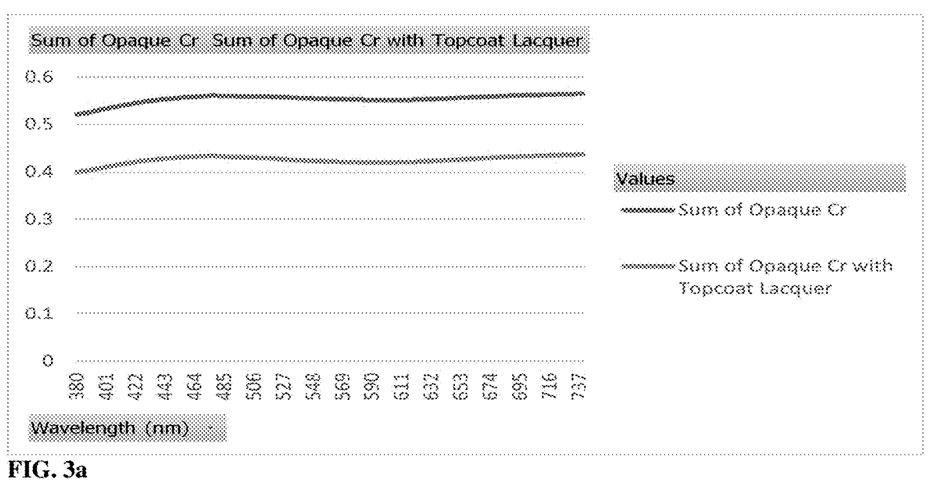
FIG. 3a is a graphical model comparing the reflectivity in air of opaque chromium PVD v. opaque chromium PVD with a topcoat of lacquer. The lacquer topcoat results in a 13% decrease in reflectivity.
Figure 3B:
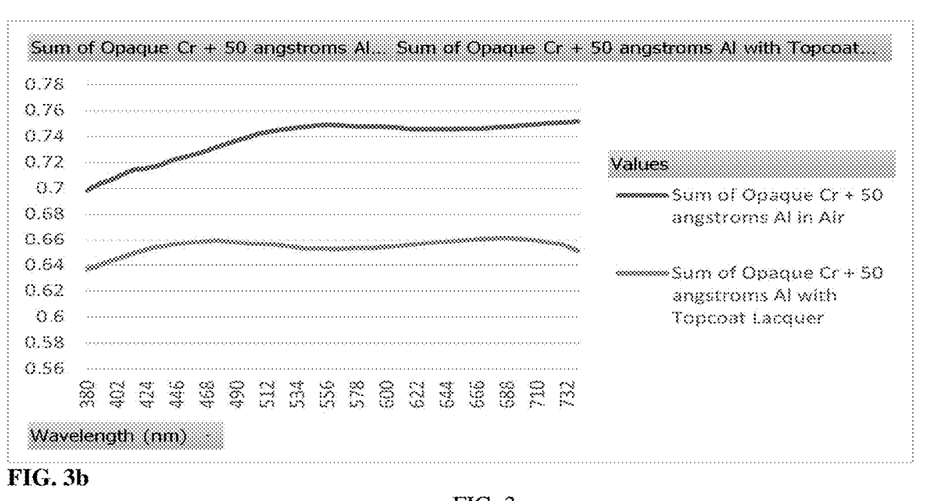
FIG. 3b is a graphical model comparing the reflectivity in air of the same opaque chromium film with an additional 50 A thick layer of aluminum v. the same stack with a lacquer topcoat ranging in thickness from 5 μm to 200 μm. The lacquer topcoat decreases the reflectivity by 9%, which is an improvement over opaque chromium alone when adding the topcoat lacquering.

Upon completion of the high index of refraction layer, a very thin layer (≤200 A) of low index of refraction metal is deposited. This layer has two purposes: firstly, it increases the reflectivity of the whole PVD film in comparison to the base high index of refraction layer. As an example, an opaque chromium PVD film in air will be 55% reflective at 632 nm (see FIG. 2). With 50 A of aluminum added to the chromium layer, reflectivity is increased to 75% in air (see FIG. 2). Secondly, it decreases the drop in reflectivity of the whole film stack when topcoat lacquered in comparison to the amount of reflectivity lost when just the high index of refraction metal is topcoat lacquered. As an example, an opaque chromium PVD film will lose 13% of reflectivity at 632 nm when comparing the film with topcoat lacquering and without. Adding 50 A of aluminum to the opaque chromium film and comparing before and after topcoat lacquering reflectivity again, the loss is only 9% at 632 nm.

The low index of refraction layer has a maximum limit of 200 A in thickness. Using the above example of aluminum on chromium, as this layer approaches 200 A, the whole PVD film begins to take on the color and optical properties of an opaque aluminum film and defeats the purpose of using the high index of refraction metals for their colors. The ability to tune the film for color is negligible beyond 200 A thickness for almost all low index of refraction metals.

High Index of Refraction Metal Selection Examples for Color/Optical Properties and Suitability of PVD Techniques Chromium (n=3.1; k=3.3 @ 632 nm) applied via PVD is not subject to REACH restriction as it does not utilize Chrome VI. It is a natural choice to replace chrome plating due to its blue hues, but requires lacquering to enable the very thin PVD film to withstand environmental effects similar to the traditional very thick chrome plating. Chromium in bulk form, as a deposition material, sublimes at high temperatures to vapor and can be deposited via any of the previously mentioned PVD techniques, with the exception of thermal evaporation, which will be problematic due to high melting temperature.

Cobalt (n=2.8; k=4.3 @ 632 nm) is another transition metal that provides a lustrous, silvery color. It is more reflective than chromium and gives an even neutral color across the visible spectrum. Cobalt can be deposited with any of the PVD process techniques but is advantageously suited for sputtering or electron beam evaporation.

Nickel (n=1.9; k=3.7 @ 632 nm) as a base PVD layer gives a higher reflection than chromium but displays a red/yellow hue. Nickel presents unique challenges for PVD processing. It can be thermally evaporated but electron beam evaporation is advantageous. Additionally, using high strength magnetrons, nickel can effectively be sputtered.

Titanium (n=2.2; k=2.9 @ 632 nm) is silvery gray in color and displays a yellow hue. It is less reflective than chromium. Titanium can effectively be deposited with any of the PVD processes.

Stainless Steel (n=2.8; k=3.8 @ 632 nm) is less lustrous and less reflective than chromium. It is gray in color and gives a pleasing, muted tone. A sputtering deposition technique is advantageous for Stainless Steel.

Low Index of Refraction Metal Selection Examples for Reflectivity Properties and Suitability of PVD Techniques Indium (n=1.1; k=2.3 @ 550 nm) is a silvery white low index of refraction post transition metal. It can effectively be deposited with any of the referenced PVD processes.

Silver (n=0.1; k=4.0 @ 632 nm) is a precious metal that readily avails itself to any of the PVD techniques. It is bright and lustrous with a very high natural reflectivity in the visible wavelength spectrum.

Aluminum (n=1.4; k=7.6 @ 632 nm) is a metal that is relatively cheap and abundant. It is highly reflective, although less than silver. It is silvery gray with a slight yellow hue. It is ideally suited for thermal evaporation or sputtering but can advantageously be deposited with any of the commercially available PVD techniques. Aluminum, although bright after top coating, is not a desirable base PVD film due to its yellow hue and inability to match the blue hues of traditional chrome plating. It is, however, an advantageous choice for a semi-transparent, second layer coating as light is either transmitted or reflected with low absorption.

Topcoat Lacquer Application

PVD films can be topcoat lacquered with many off the shelf commercial solutions. These can be air dried at room temperature, thermally cured, UV cured, or some combination thereof. Red Spot Paint and Varnish Company and Momentive are examples of companies who make formulations specifically for adhesion to, and protection of, PVD films for many different applications.

These paint lines, often robotic, take PVD coated parts from the PVD machine, perform an ionized air de-stat operation, paint the part through spray or dip coating, prepare the part for curing in an elevated temperature environment and then cure at a further elevated temperature with time or through UV exposure.

Reflectivity and Color Evaluation

An integrating sphere and appropriate wavelength laser can be utilized to measure the reflectivity of the coating stack to include the topcoat paint. One can measure the strength of the laser by focusing the laser directly in the center of the integrating sphere and using a detector and power meter. The laser than can be moved parallel to the opening of the integrating sphere and the PVD coated, and painted part, can be held at a 45-degree angle reflecting the laser into the integrating sphere. By measuring the laser power output using the same detector and power meter, a simple calculation of the measured power reflecting off the film to the measured baseline power of the laser will give the percent reflectivity of the PVD film stack with topcoat paint.

Color can be measured using a spectrophotometer to define the L*a*b* values to see the degree to which the thickness of the top layer of PVD affects the color layer, and the degree to which the topcoat lacquer affects the entire PVD film stack. Spectrophotometers measure reflectance and transmittance through a material as a function of wavelength (R. Berns, *Billmeyer and Saltzman's Principles of Color Technology*, Third Edition, 88, (2000)). They are useful instruments as they can separate out gloss levels and closely match how the human eye determines color. They are a way to clearly define color values of the multi-layer PVD film as well as the entire film stack with topcoat lacquer.

Exemplary Embodiment: Aluminum on Chromium

Figure 4:
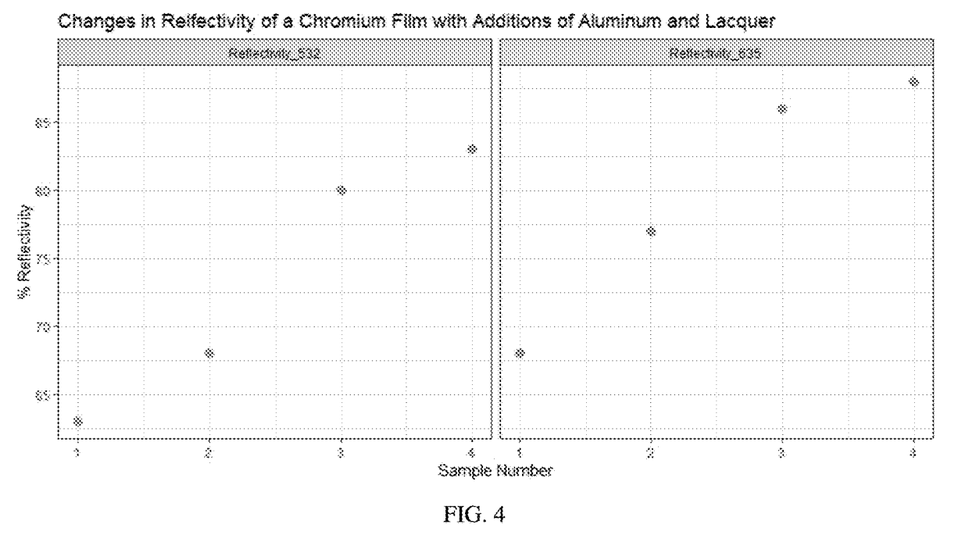
FIG. 4 is a plot of the reflectivity of chromium topped with aluminum and lacquer, according to an exemplary, non-limiting embodiment. Reflectivity, that is, brightness, increases with increasing aluminum thickness. Reflectivity is measured at 532 nm (left) and 635 nm (right).
Figure 5:
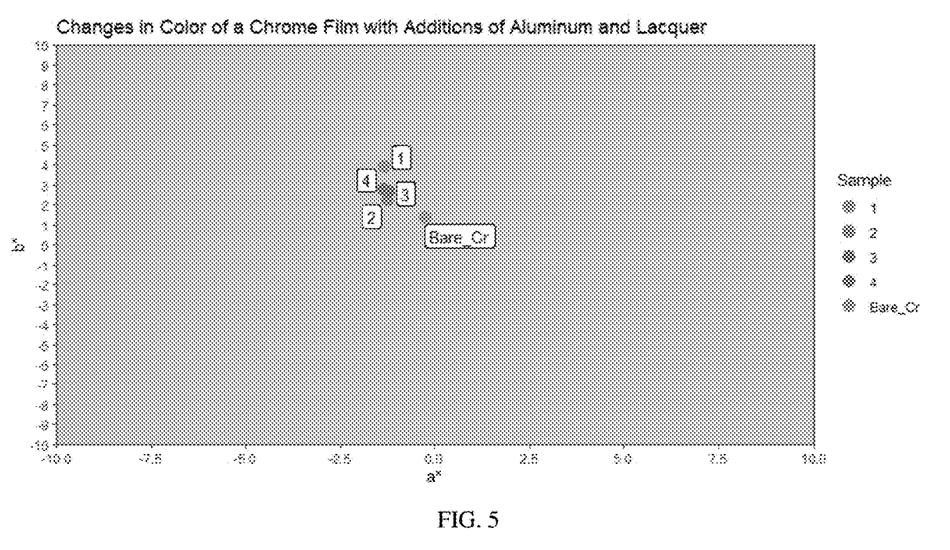
FIG. 5 is a plot of the L*a*b* color values (widely accepted as a method based on the complementary relationships between yellow, blue, green, and red, whereby humans perceive color) of each of five (four and a reference) chromium-based samples against the LAB color space background. Addition of aluminum pushes B values down, towards the blue/purple area of the plot and away from the yellow/red area. L*a*b* values for samples with aluminum and lacquer (samples 2-4) are closer to those of bare chromium than those with only chromium and lacquer (sample 1). Background color is provided as a guideline. While L*a*b* values are objective, the appearance of colors depends on monitor settings, individual vision, and other factors and should not be taken literally.
Figure 6:
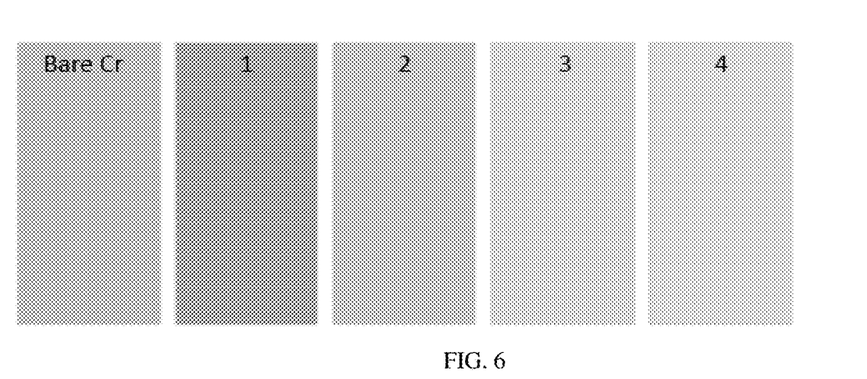
FIG. 6 is an illustration of color changes across the chromium-based samples with application of aluminum and lacquer shown in FIG. 5, according to an exemplary, non-limiting embodiment. Colors are generated from measured L*a*b* values, which are objective. The subjective appearance of these colors will depend on computer monitor settings, individual vision, and other factors and should not be taken literally.

With reference to FIGS. 4-6, four samples were prepared as four respective thin film stacks, each first comprising of a sputtered layer of chromium, with a thickness of >50 nm. Aluminum was then sputtered atop the chromium to thicknesses as denoted below.

| Sample Number | Cr Layer Thickness | Al Layer Thickness |
|---|---|---|
| 1 | >50 nm | 0 nm |
| 2 | >50 nm | ~5 nm |
| 3 | >50 nm | ~10 nm |
| 4 | >50 nm | ~15 nm |

Each of the samples 1-4 was then sprayed with a layer of protective lacquer and UV cured. FIG. 4 shows the reflectivity of chromium topped with aluminum and lacquer, measured at 532 nm (left) and 635 nm (right). FIG. 5 illustrates the color of each chromium-based samples in LAB space. Background color is provided as a guideline. As shown in FIG. 5, the addition of aluminum yields samples (2-4) that are brighter, i.e., more reflective, than bare chromium (1). FIG. 6 is an illustration of color changes across chromium-based samples with application of aluminum. Colors are generated from measured LAB values, which are objective. The subjective appearance of these colors will depend on computer monitor settings, individual vision, and other factors and should not be taken literally. While direct visualization of color depends on monitor settings, individual vision characteristics, as well as other factors, changes in color across the range of samples produced in this embodiment are dramatic and can be observed by the naked eye. Visually perceptible changes indicate the suitability of this approach to decorative applications.

As demonstrated, samples of chromium with thin, <20 nm, layers of aluminum on top of them are much more reflective following lacquering. Gains in reflectivity are as much as 25 percentage points. Simultaneously the natural chromium color can be significantly retained, despite addition of aluminum.

Exemplary Embodiment: Aluminum on Titanium

Figure 7:
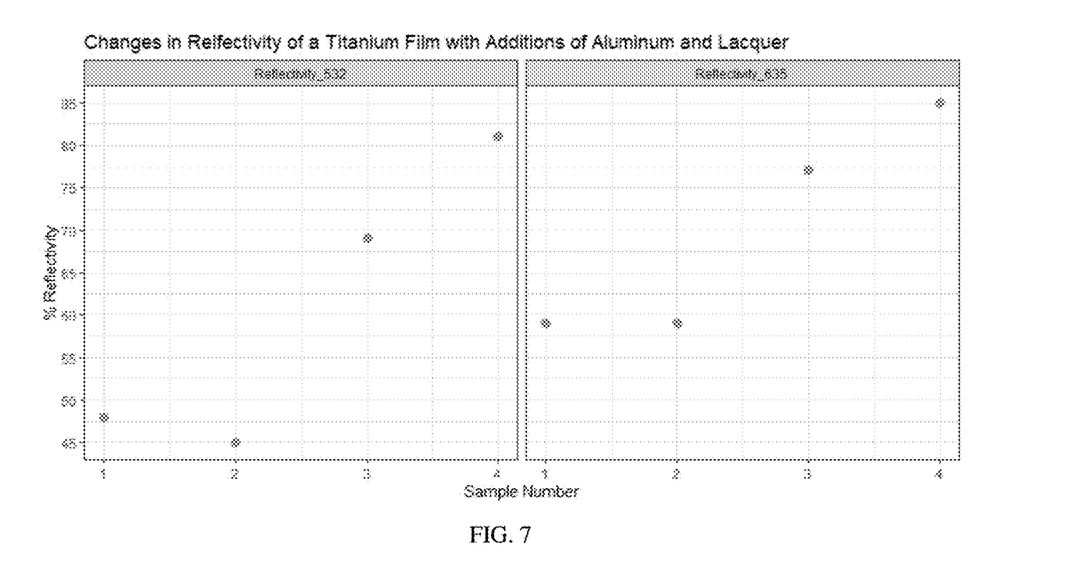
FIG. 7 is a plot of the reflectivity of five (four and a reference) samples of titanium topped with aluminum and lacquer, according to an exemplary, non-limiting embodiment. Reflectivity, that is, brightness, increases with increasing aluminum thickness. Reflectivity is measured at 532 nm (left) and 635 nm (right).
Figure 8:
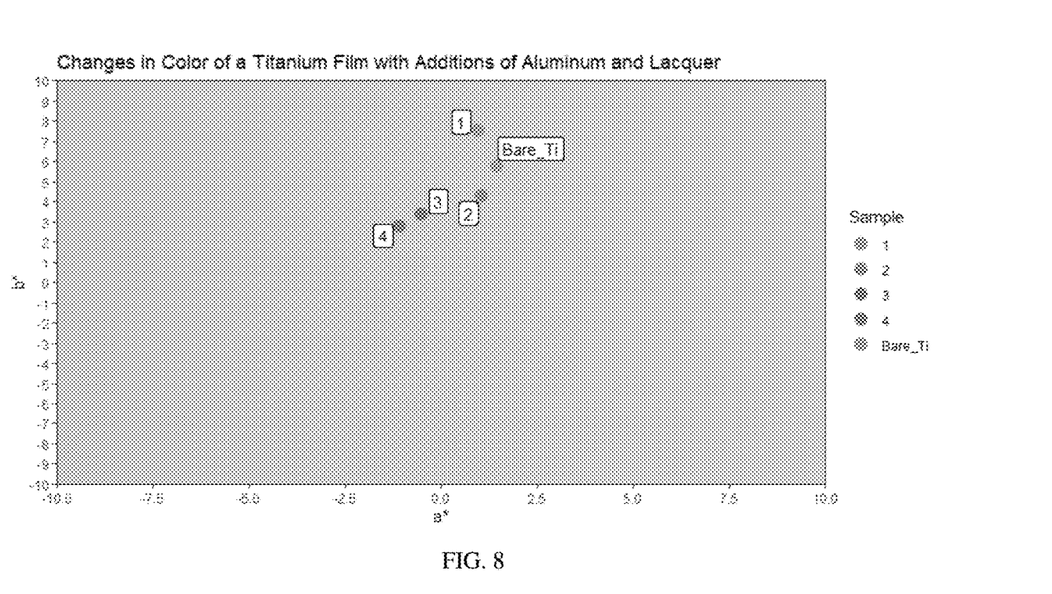
FIG. 8 is a plot of the L*a*b* color values of each of the titanium-based samples against the L*a*b* color space background, according to an exemplary, non-limiting embodiment. Addition of aluminum pushes A and B values down, towards the blue/purple area of the plot and away from the yellow/red area. L*a*b* values for samples with aluminum and lacquer (2-4) are bluer than even those of bare titanium and significantly bluer than those with only titanium and lacquer (sample 1). Background color is provided as a guideline. While L*a*b* values are objective, the appearance of colors depends on monitor settings, individual vision, and other factors and should not be taken literally.
Figure 9:
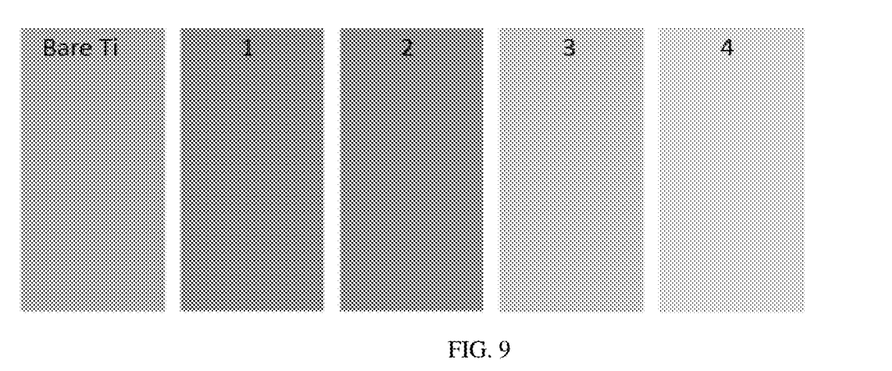
FIG. 9 is an illustration of color changes across the titanium-based samples of FIG. 8 with application of aluminum and lacquer, according to an exemplary, non-limiting embodiment. Colors are generated from measured L*a*b* values, which are objective. The subjective appearance of these colors will depend on computer monitor settings, individual vision, and other factors and should not be taken literally.

With reference to FIGS. 7-9, four samples were prepared as four respective thin film stacks, each first comprising of a sputtered layer of titanium, with a thickness of >50 nm. Aluminum was then sputtered atop the titanium with thicknesses as denoted below.

| Sample Number | Ti Layer Thickness | Al Layer Thickness |
|---|---|---|
| 1 | >50 nm | 0 nm |
| 2 | >50 nm | ~5 nm |
| 3 | >50 nm | ~10 nm |
| 4 | >50 nm | ~15 nm |

Each of the samples 1-4 was then spray-coated with a layer of protective lacquer and UV-cured. FIG. 7 shows the reflectivity of titanium topped with aluminum and lacquer, measured at 532 nm (left) and 635 nm (right). FIG. 8 illustrates the color of each titanium-based samples in LAB space. Background color is provided as a guideline. As shown in FIG. 8, the addition of aluminum yields samples (2-4) that are brighter, i.e., more reflective, than bare titanium (1). FIG. 9 is an illustration of color changes across titanium-based samples with application of aluminum. Colors are generated from measured LAB values, which are objective. The subjective appearance of these colors will depend on computer monitor settings, individual vision, and other factors and should not be taken literally.

Exemplary Embodiment: Aluminum on Cobalt

Figure 10:
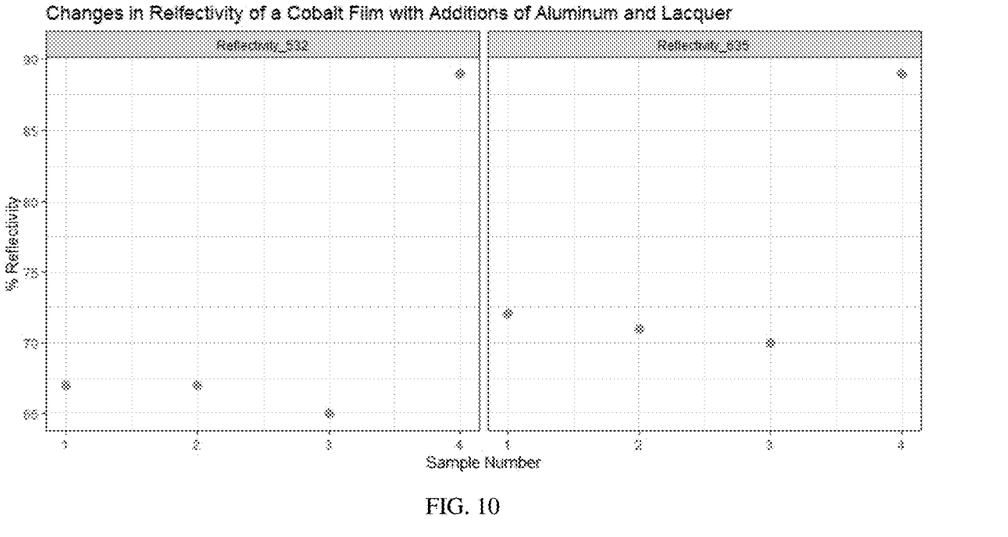
FIG. 10 is a plot of the reflectivity of five (four and a reference) samples of cobalt topped with aluminum and lacquer, according to an exemplary, non-limiting embodiment. Reflectivity, that is, brightness, increases with increasing aluminum thickness. Reflectivity is measured at 532 nm (left) and 635 nm (right).
Figure 11:
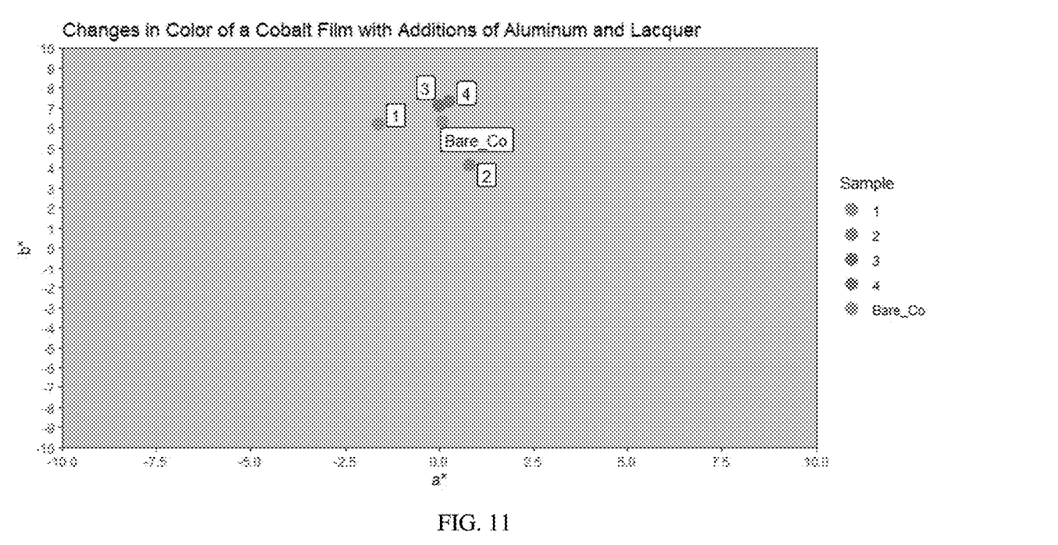
FIG. 11 is a plot of the L*a*b* color values of each of the cobalt-based samples of FIG. 10 against the L*a*b* color space background, according to an exemplary, non-limiting embodiment. Addition of aluminum pushes A and B values down, towards the blue/purple area of the plot and away from the yellow/red area. L*a*b* values for samples with aluminum and lacquer (2-4) are bluer than even those of bare titanium and significantly bluer than those with only titanium and lacquer (sample 1). Background color is provided as a guideline. While L*a*b* values are objective, the appearance of colors depends on monitor settings, individual vision, and other factors and should not be taken literally.
Figure 12:
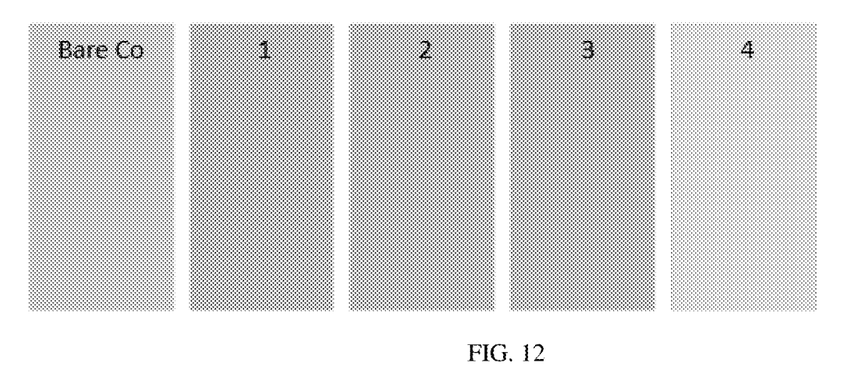
FIG. 12 is an illustration of color changes across the cobalt-based samples of FIG. 10 with application of aluminum and lacquer, according to an exemplary, non-limiting embodiment. Colors are generated from measured L*a*b* values, which are objective. The subjective appearance of these colors will depend on computer monitor settings, individual vision, and other factors and should not be taken literally.

With reference to FIGS. 10-12, four samples were prepared as four thin film stacks, each first comprising of a sputtered layer of cobalt, with a thickness of >50 nm. Aluminum was then sputtered atop the cobalt with thicknesses as denoted below.

| Sample Number | Co Layer Thickness | Al Layer Thickness |
|---|---|---|
| 1 | >50 nm | 0 nm |
| 2 | >50 nm | ~5 nm |
| 3 | >50 nm | ~10 nm |
| 4 | >50 nm | ~15 nm |

Each of the samples 1-4 was then spray-coated with a layer of protective lacquer and UV-cured. FIG. 10 shows the reflectivity of cobalt topped with aluminum and lacquer, measured at 532 nm (left) and 635 nm (right). FIG. 11 illustrates the color each cobalt-based samples in LAB space. Background color is provided as a guideline. As shown in FIG. 11, the addition of aluminum yields samples (2-4) that are brighter, i.e., more reflective, than bare cobalt (1). FIG. 12 is an illustration of color changes across cobalt-based samples with application of aluminum. Colors are generated from measured LAB values, which are objective. The subjective appearance of these colors will depend on computer monitor settings, individual vision, and other factors and should not be taken literally.

While various disclosed embodiments have been described above, it should be understood that they have been presented by way of example only and not as a limitation. Numerous changes to the disclosed embodiments can be made in accordance with the specification herein without departing from the spirit or scope of this specification. Thus the breadth and scope of this specification should not be limited by any of the above-described embodiments; rather, the scope of this specification should be defined in accordance with the appended claims and their equivalents.

We claim:

1. A thin film stack composition for application onto a substrate, comprising:
    a first metallic layer disposed immediately adjacent the substrate surface comprising a metal or a metallic alloy thereof having an index of refraction equal to or greater than 1.9 measured at 632 nm, said first metallic layer having a total thickness equal to or greater than 250 angstroms (Å);
    a second metallic layer disposed immediately adjacent the first metallic layer comprising a metal or a metallic alloy thereof having an index of refraction greater than zero and equal to or less than 1.5 measured at 632 nm, said second metallic layer having a total thickness greater than zero and equal to or less than 200 Å, wherein the second metallic layer is semi-transparent over the visible spectrum; and
    a non-metallic topcoat layer disposed immediately adjacent the second metallic layer,
    wherein the topcoat layer is substantially transparent over the visible spectrum, whereby darkening of the first metallic layer by the topcoat layer is reduced or eliminated.

2. The thin film stack composition of claim 1, wherein the metal of the first metallic layer is at least one of Co, Cr, Fe, Ge, Mo, Ni, Pb, Pd, Pt, Re, Rh, Si, Sn, Ti, V, W, Zn or a metallic alloys thereof.

3. The thin film stack composition of claim 1, wherein the metal of the second metallic layer is at least one of Ag, Al, Au, Cu, In, Ir, Mg, or a metallic alloys thereof.

4. The thin film stack composition of claim 1, wherein the metal of the first metallic layer is Chromium and the metal of the second metallic layer is Aluminum.

5. The thin film stack composition of claim 1, wherein the metal of the first metallic layer is Titanium and the metal of the second metallic layer is Aluminum.

6. The thin film stack composition of claim 1, wherein the metal of the first metallic layer is Cobalt and the metal of the second metallic layer is Aluminum.

7. The thin film stack composition of claim 1, wherein the topcoat layer is a lacquer or a paint.

8. The thin film stack composition of claim 1, wherein the thin film stack composition is a PVD stack.

9. A method for creating a highly reflective, decorative, film/thin film coating on a substrate, comprising:
    providing a substrate to be coated;
    using PVD to deposit a first metallic layer of a metal or a metallic alloy thereof having an index of refraction equal to or greater than 1.9 measured at 632 nm on the substrate, at a total thickness equal to or greater than 250 Å;
    using PVD to deposit a second metallic layer of a metal or a metallic alloy thereof having an index of refraction greater than zero and equal to or less than 1.5 measured at 632 nm onto the first metallic layer, at a total thickness greater than zero and equal to or less than 200 Å, wherein the second metallic layer is semi-transparent over the visible spectrum; and
    applying a protective, non-metallic, substantially transparent topcoat layer on the second metallic layer.

10. The method of claim 9, further comprising drying the topcoat layer.

11. The method of claim 9, wherein the topcoat layer is a lacquer or a paint.

* * * * *